United States Patent [19]
Chow

[11] Patent Number: 5,818,287
[45] Date of Patent: Oct. 6, 1998

[54] GATE-SWITCHING CHARGE-PUMP IMPLEMENTED INSIDE A PHASE LOCKED LOOP

[75] Inventor: Hugh Chow, Thornhill, Canada

[73] Assignee: ATI Technologies Inc., Unionville, Canada

[21] Appl. No.: 667,875

[22] Filed: Jun. 20, 1996

[51] Int. Cl.[6] .............................. H03L 7/089; G05F 3/16
[52] U.S. Cl. .................... 327/536; 327/537; 327/437; 327/157
[58] Field of Search ..................................... 327/536, 537, 327/374, 427, 434, 436, 437, 313, 328, 148, 157

[56] References Cited

U.S. PATENT DOCUMENTS

| | | | |
|---|---|---|---|
| 4,612,466 | 9/1986 | Stewart | 307/585 |
| 4,792,705 | 12/1988 | Ouyang et al. | 307/296 R |
| 5,153,530 | 10/1992 | Takagi et al. | 331/17 |
| 5,285,483 | 2/1994 | Ogawa et al. | 375/120 |
| 5,293,082 | 3/1994 | Bathaee | 307/270 |
| 5,339,050 | 8/1994 | Llewellyn | 331/16 |
| 5,362,990 | 11/1994 | Alvarez et al. | 327/538 |
| 5,453,680 | 9/1995 | Giolma et al. | 323/315 |

*Primary Examiner*—Timothy P. Callahan
*Assistant Examiner*—An T. Luu
*Attorney, Agent, or Firm*—E. E. Pascal; R. A. Wilkes; H. C. Baker

[57] ABSTRACT

A charge pump comprising a first branch PMOS FET having a source connected to a voltage source and a drain connected to an output node, a second branch NMOS FET having a drain connected to the output node and a source connected to a ground node, first apparatus for selectively switching a gate of the PMOS FET between its source and a first bias voltage source, and second apparatus for selectively switching a gate of the NMOS FET between its source and a second bias voltage source, the bias voltages being of magnitudes such that the first branch PMOS FET and second branch NMOS FET will source and sink the same magnitude of current when the FETs are fully conducting.

6 Claims, 2 Drawing Sheets

GATE-SWITCHING CHARGE-PUMP IMPLEMENTED INSIDE A PHASE LOCKED LOOP

FIELD OF THE INVENTION

This invention relates to a phase locked loop, and in particular to a charge pump used within the phase locked loop.

BACKGROUND TO THE INVENTION

Many clock circuits are driven by phase locked loops (PLLs), in order to obtain stability in frequency and phase of the clock signal. Such circuits are used, for example, in modern high speed video graphics display circuits, to generate video rate clock signals.

A phase locked loop is shown in FIG. 1. The pulse output signal of a reference oscillator 1 is divided by a reference frequency divider 2. The resulting lower frequency signal is applied to one input of a phase-frequency detector (PFD) 3. A feedback signal from the output of the phase locked loop is applied to another input of detector 3. The detector 3 outputs pulses the width of which are directly proportional to the phase difference between the signals applied to the respective inputs.

The output pulses of detector 3 are applied to a charge pump 4, which sources or sinks electronic charge to or from its output in an amount which is determined by the width of its input pulses. The output of the charge pump is filtered in a loop filter 5, and then is input to a voltage controlled oscillator 6. The frequency of voltage controlled oscillator 6 is thus controlled. After buffering in buffer 7, the signal is output to a post frequency divider 8, if desired. The output signal frequency of buffer 7 is divided in a feedback frequency divider 9, and the thus divided output signal is applied to an input of the phase frequency detector 3 as the feedback signal referred to above.

During frequency synthesizing, the output clock frequency is determined by the frequency of the reference oscillator 1 and the dividing ratios of the divider 2, the divider 9 and the divider 8. For any fixed combination of dividing ratios and a fixed frequency of oscillator 1, the phase locked loop may output a clock signal of which the frequency is invariant in the time domain. At all times the charge pump sources or sinks electronic charges to or from its output in an amount which is determined by the width of pulses input thereto, which is determined by any phase difference between the output signal of the phase locked loop (from buffer 7) and the input oscillator signal (from divider 2).

However, the phase locked loop requires a passive second order loop filter. When forming clock synthesizers in integrated circuits, use of external passive components for the loop filter becomes undesirable; it is desirable to provide the filter components on-chip. To achieve a cost effective and small integrated second order RC loop filter in-chip, the charge pump has to lower the ratio of output charge against input phase error for the PLL to retain proper stability. This ratio can be considered to be pump current, since current by definition is the first derivative of electric charge with respect to time.

Charge pump based phase locked loops have used drain or source switching, in MOS circuits. This always suffers from parasitic injected charge during channel formation of the MOS current source and switch. As the pump current decreases in a charge pump, parasitic charge injection during switching becomes of a magnitude which is comparable to the desired injected charge which is proportional to the input phase error described above. The net injected charge is therefore very sensitive to parasitic charge in monolithic integrated circuit fabrication process, is not accurately characterized, and introduces a mismatch. As a result, loop stability is not well predictable.

In addition, the parasitic charge injection typically has a time constant which is a considerable portion of the correction cycle of the phase locked loop. The jitter that results from this circuit is another big drawback of conventional drain or source switching used in PLLs.

SUMMARY OF THE INVENTION

The present invention has been found to significantly decrease the amount of parasitic injected charge, i.e. by at least half that obtained using conventional drain or source switching. Further, the parasitic charge injection time constant is significantly reduced, since the dominant part of the series resistance along the charge injection path that is contributed by the MOS switch in the conventional drain or source switching charge pump does not exist in the present invention. Loop stability of the PLL is thus made much more predictable than in the past, and jitter performance is significantly improved, particularly at high reference clock frequency in which the parasitic charge injection time constant is a significant proportion of the correction cycle of the PLL.

In accordance with an embodiment of the present invention, a charge pump comprises a first branch PMOS FET having a source connected to a voltage source and a drain connected to an output node, a second branch NMOS FET having a drain connected to the output node and a source connected to a ground node, first apparatus for selectively switching a gate of the PMOS FET between its source and a first bias voltage source, and second apparatus for selectively switching a gate of the NMOS FET between its source and a second bias voltage source.

In accordance with another embodiment, a charge pump comprises a first branch PMOS FET having a source connected to a voltage source and a drain connected to an output node, a second branch NMOS FET having a drain connected to the output node and a source connected to a ground node, first apparatus for selectively switching a gate of the PMOS FET between its source and a first bias voltage source, second apparatus for selectively switching a gate of the NMOS FET between its source and a second bias voltage source, the bias voltages being of magnitudes such that the first branch PMOS FET and second branch NMOS FET will source and sink the same magnitude of current when the FETs are fully conducting.

BRIEF INTRODUCTION TO THE DRAWINGS

A better understanding of the invention will be obtained by considering the detailed description below, with reference to the following drawings, in which.

DETAILED DESCRIPTION OF EMBODIMENTS OF THE INVENTION

Figure 2:
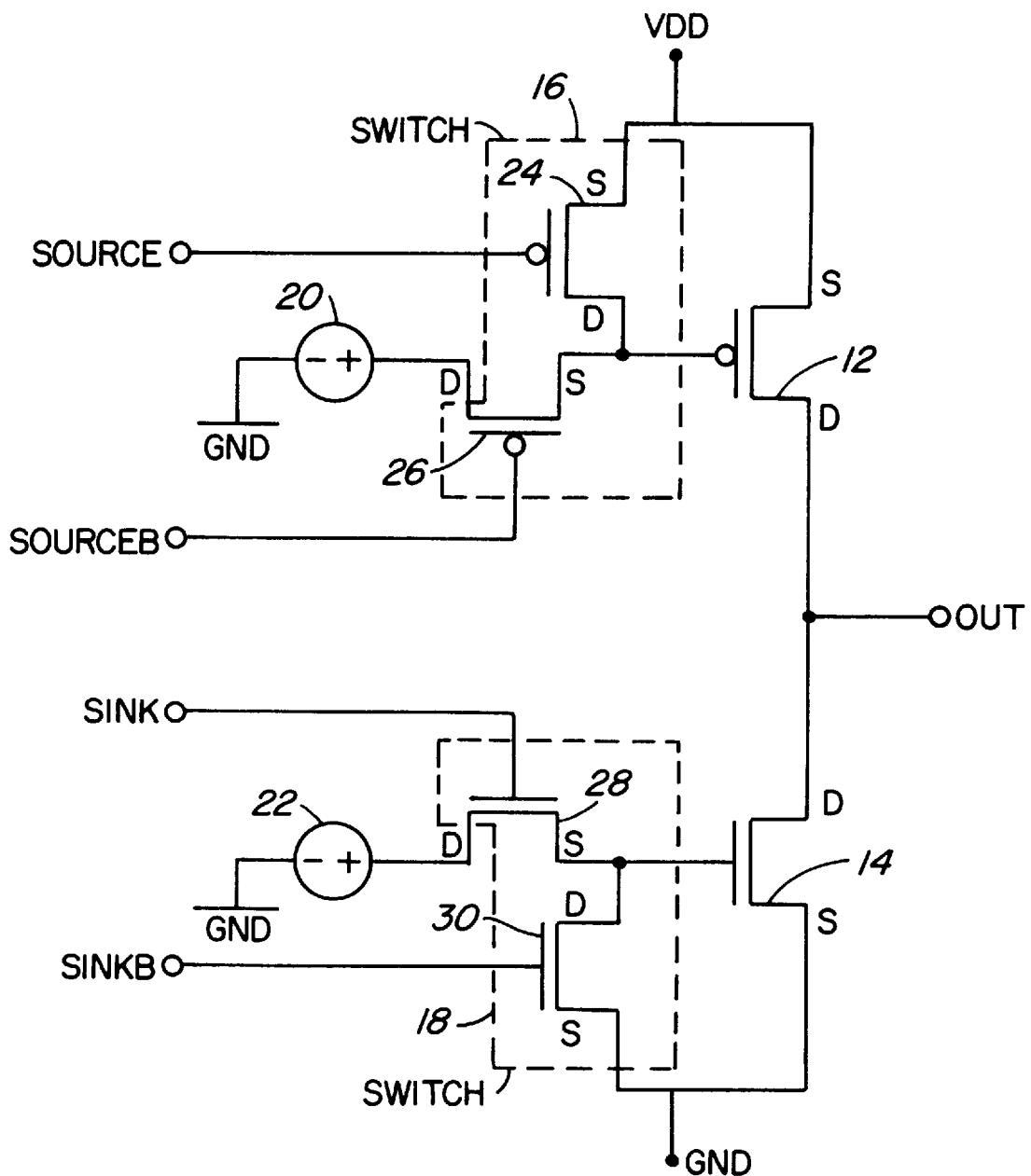
FIG. 2 is a schematic diagram of a preferred embodiment of the present invention.

In accordance with an embodiment of the invention, as shown in FIG. 2, a current source is comprised of a PMOS FET 12 which has its source connected to a fixed voltage source VDD, and its drain connected to an output node OUT. A current sink is comprised on an NMOS FET 14 which has its drain connected to the output node OUT, and its source connected to ground.

The gate of the PMOS FET 12 is connected to a switch 16 which selectively switches the gate of FET 12 to either a source of bias voltage 20 or to the source of FET 26. The gate of FET 14 is connected to a switch 18 which selectively switches the gate of FET 14 to either a source of bias 22 or to the source of FET 14.

Figure 3:
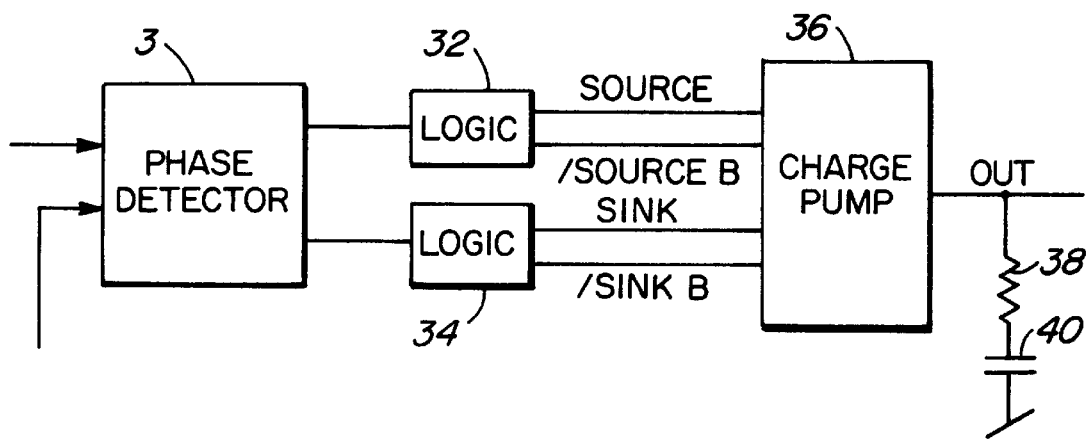
FIG. 3 is a block diagram of another embodiment of the present invention.

Switches 16 and 18 are driven a signal which selectively causes PMOS FET 12 and NMOS FET 14 to conduct, thus sourcing or sinking current to or from the output OUT. When used in a PLL, the inputs to switches 16 and 18 are obtained from the outputs of the frequency/phase detector 3 (FIG. 3).

The bias voltages should be of such magnitudes that the PMOS FET and the NMOS FET form constant current sources so that they will source and sink the same magnitude of current when they conduct. To obtain this result, the bias voltage of bias source 20, which appears at the gate of PMOS FET 12, should be at least one threshold voltage Vtp more negative than the source voltage of PMOS FET 12. The drain of the PMOS FET 12 should be at a voltage which is no more positive than one Vtp above the gate voltage of PMOS FET 12. The bias voltage of bias source 22, which appears at the gate of NMOS FET 14, should be at least one threshold voltage Vtn more positive than the source voltage of the NMOS FET 14. The drain of the NMOS FET 14 should be no more negative than one Vtn below the gate voltage of NMOS FET 14.

With these conditions, when conducting the FETs 12 and 14 are saturated, and PMOS FET 12 becomes a constant current source and NMOS FET 14 becomes a constant current sink. The current source or sink from or to the drains of the two FETs are thus independent of the node voltage at the drains of the FETs, as long as the above criteria are satisfied.

To turn the constant current sources or sinks on or off, the gate voltages are connected to either the corresponding sources (turn off) or to the bias voltage sources (turn on).

FIG. 2 illustrates a preferred switching structure for turning the PMOS and NMOS FETs on and off. A switching PMOS FET 24 is connected with its source to VDD and its drain to the gate of FET 12. Another switching PMOS FET 26 is connected with its source to the gate of FET 12 and its drain to bias voltage source 20. A switching NMOS FET 28 has its source connected to the gate of FET 14 and its drain connected to the bias voltage source 22, and another switching NMOS FET 18 has its source connected to ground and its drain connected to the gate of FET 14.

Control signals to operate the charge pump are SOURCE, applied to the gate of FET 24, and its logical inverse /SOURCEB, applied to the gate of FET 26, and SINK, applied to the gate of FET 28, and its logic inverse /SINKB, applied to the gate of FET 30.

By imposing a logic voltage of the value VDD to the SOURCE input, and a logic voltage of ground value to the /SOURCEB input, PMOS FET 24 is turned off, and PMOS FET 26 is turned on, conducting the bias voltage from bias source 20 to the gate of FET 12. As long as the drain voltage, or the output voltage of the charge pump satisfies the criteria noted earlier with respect to FET 12, the charge pump sources a predictable magnitude of current to output node OUT. The amount of positive charge sourced to OUT will be proportional to the time extent of signals SOURCE and /SOURCEB.

By imposing a logic voltage of the value VDD to the SINK input, and a voltage of ground to the /SINKB input, FET 30 is turned off, and FET 28 is turned on, and passes the bias voltage from bias source 22 to the gate of FET 14. As long as the drain voltage of FET 14, or the output voltage of the charge pump satisfies the constraints noted earlier with respect to FET 14, the charge pump sinks a predictable magnitude of current from its output OUT. The amount of positive charge sunk from the output OUT of the charge pump is proportional to the time extent of the signals SINK and /SINKB.

On the other hand, by imposing a ground voltage to the SOURCE input, and a voltage VDD at /SOURCEB, FET 26 is turned off, and FET 24 is turned on and passes VDD to the gate of FET 12. The source in branch of the charge pump is then off. By imposing a ground voltage to the SINK input, and a voltage of VDD at /SINKB, FET 28 is turned off, and FET 30 is turned on and passes ground to the gate of FET 14. The sink branch of the charge pump is then off.

Figure 1:
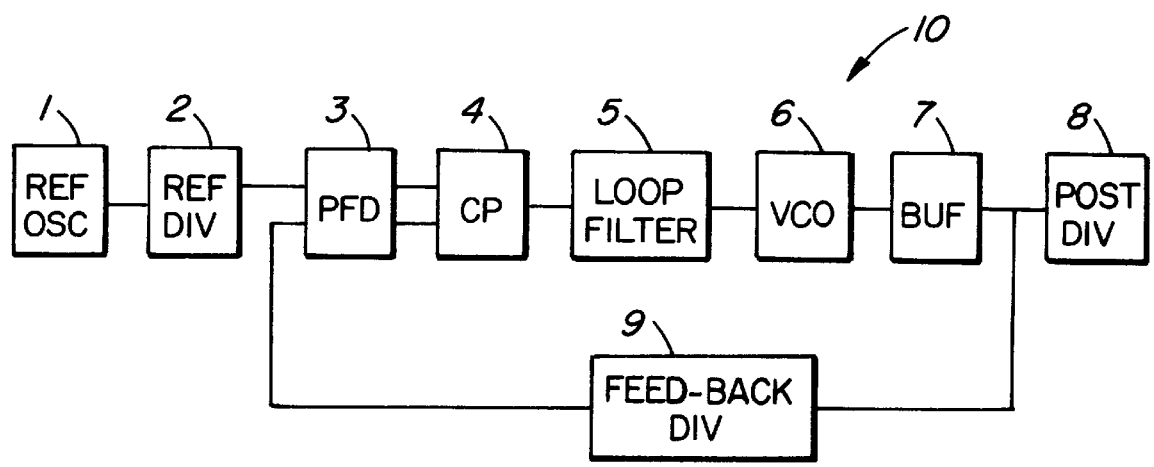
FIG. 1 is a block diagram of a phase locked loop.

FIG. 3 illustrates how the circuit of FIG. 2 is connected in a PLL such as in FIG. 1. The outputs of phase detector are up and down signals, which are applied to logic circuits 32 and 34. The logic circuits convert the up and down signals to noninverted and inverted versions thereof, i.e. SOURCE and /SOURCEB, and SINK and /SINKB signals respectively. These signals are applied to the corresponding inputs of the circuit of FIG. 2, shown as charge pump block 36 in FIG. 3. Alternatively, the up and down signals, which correspond to source and sink control signals, are applied to control inputs of switches 16 and 18 (not independently shown), to operate the switches and cause the respective gates of FETs 12 and 14 to be connected as described earlier.

The above-described gate switching charge pump minimizes the amount of parasitic charge injected into and/or out of the charge pump output when the constant current source and/or sink is on (conducting), since there is only one FET in each of the current sourcing branch and current sinking branch. As well, the gate switching charge pump shortens the parasitic charge injecting time constant since there is no series resistance introduced by any switch on the path of charge injection.

With reference to FIG. 2, the output OUT of the charge pump is connected to a loop filter, comprised of a resistor 38 connected in series with a capacitor 40 between OUT and a fixed voltage source. The filter can be implemented in an integrated circuit with the remaining FETs of the charge pump, due to the improved charge pump characteristics described earlier resulting from decreased parasitic charge injection.

A person understanding this invention may now conceive of alternative structures and embodiments or variations of the above. All those which fall within the scope of the claims appended hereto are considered to be part of the present invention.

I claim:

1. A charge pump comprising:
   (a) a first branch PMOS FET having a source connected to a voltage source and a drain connected to an output node,
   (b) a second branch NMOS FET having a drain connected to the output node and a source connected to a ground node,
   (c) first means for selectively switching a gate of the PMOS FET between its source and a first bias voltage source, and
   (d) second means for selectively switching a gate of the NMOS FET between its source and a second bias voltage source, (e) said bias voltages being of magnitudes such that said first branch PMOS FET and second branch NMOS FET will source and sink the same magnitude of current when said FETs are fully conducting, and the first bias voltage is at least one threshold voltage Vtp more negative than voltage of the source of the PMOS FET, and the second bias voltage is at least one threshold voltage Vtn more positive than voltage of the source of the NMOS FET.

2. A charge pump as defined in claim 1 in which the voltage at the output node to which the drains of both PMOS and NMOS FETs are connected are no more positive than one Vtp above the gate voltage of the PMOS FET and no more negative than one Vtn below the gate voltage of the NMOS FET.

3. A charge pump as defined in claim 1 in which the means for switching the gate of the PMOS FET is comprised of further PMOS FETs, and the means for selectively switching the gate of the NMOS FET is comprised of further NMOS FETs.

4. A charge pump as defined in claim 2 in which said first means is comprised of a first PMOS switching FET having its source connected to said voltage source and its drain connected to the gate of the first branch PMOS FET, and a second PMOS switching FET having its source connected to the gate of the first branch PMOS FET and its drain connected to the first bias voltage source, and means for applying inverse logic signals to respective gates of the first and second PMOS switching FETs, and in which said second means is comprised of a first NMOS switching FET having its source connected to the gate of the second branch NMOS FET and its drain connected to the second bias voltage source and a second NMOS switching FET having its drain connected to the gate of the second branch NMOS FET and its source to the ground node, and means for applying inverse logic signals to respective gates of the first and second PMOS switching FETs.

5. A charge pump as defined in claim 4 contained in a phase locked loop (PLL) comprising a phase comparator for comparing phases of an input pulse signal and an output pulse signal of the PLL and for outputting source and sink signals respectively related to a phase difference between the input and output pulse signals, means for deriving logic inverse source and sink signals from said source and sink signals, and means for applying said source signal and the inverse logic source signal to respective gates of the first and second PMOS switching FETs, and means for applying said sink signal and said inverse logic sink signal to respective gates of the first and second NMOS switching FETs.

6. A charge pump as defined in claim 5 further including a loop filter connected between the output node and a fixed voltage source, the loop filter being comprised of a resistor in series with a capacitor, in an integrated circuit with said PMOS and NMOS FETs.

* * * * *